United States Patent
Ibbetson et al.

(10) Patent No.: US 6,515,313 B1
(45) Date of Patent: Feb. 4, 2003

(54) HIGH EFFICIENCY LIGHT EMITTERS WITH REDUCED POLARIZATION-INDUCED CHARGES

(75) Inventors: James Ibbetson, Goleta, CA (US); Brian Thibeault, Santa Barbara, CA (US)

(73) Assignee: Cree Lighting Company, Goleta, CA (US)

(*) Notice: Subject to any disclaimer, the term of this patent is extended or adjusted under 35 U.S.C. 154(b) by 0 days.

(21) Appl. No.: 09/728,788

(22) Filed: Nov. 28, 2000

Related U.S. Application Data (60) Provisional application No. 60/168,495, filed on Dec. 2, 1999.

(51) Int. Cl.⁷ .................................. H01L 33/00
(52) U.S. Cl. .................. 257/103; 257/94; 257/101; 257/102
(58) Field of Search ............................ 257/103

(56) References Cited

U.S. PATENT DOCUMENTS

| | | | |
|---|---|---|---|
| 4,301,616 A | 11/1981 | Gudgel | 46/228 |
| 4,725,128 A | 2/1988 | Bornzin et al. | 46/228 |
| 5,165,065 A | 11/1992 | Reed et al. | 307/311 |
| 5,432,808 A * | 7/1995 | Hatano et al. | 372/45 |
| 5,578,839 A | 11/1996 | Nakamura et al. | 257/96 |
| 5,670,798 A * | 9/1997 | Schetzina | 257/96 |
| 5,694,412 A | 12/1997 | Hunter et al. | 372/96 |
| 5,767,581 A * | 6/1998 | Nakamura et al. | 257/749 |
| 5,793,054 A | 8/1998 | Nido | 257/18 |
| 5,813,148 A | 9/1998 | Guerra | 36/137 |
| 5,909,040 A | 6/1999 | Ohba et al. | 257/190 |
| 5,959,307 A | 9/1999 | Nakamura et al. | 257/14 |
| 6,288,416 B1 * | 9/2001 | Koike et al. | 257/94 |

FOREIGN PATENT DOCUMENTS

EP  0905799 A2  3/1999

OTHER PUBLICATIONS

Hangleiter et al., "The role of piezoelectric fields in GaN–based quantum wells" 1998, MRS internet J. Nitride Semicond. Res. v 3, pp. 1–8.*

O'Shea et al, *Introduction to Lasers and Their Applications*, Addison–Wesley Publishing Company, Dec. 1978, pp. 166–167.

Bernardini et al, "Spontaneous polarization and piezoelectric constants of III–V nitrides," *American Physical Society Journal*, Physics Review B, vol. 56, No. 16, 1997, pp. R10 024 to R10 027.

(List continued on next page.)

Primary Examiner—Phat X. Cao
Assistant Examiner—Douglas A. Wille
(74) Attorney, Agent, or Firm—Koppel, Jacobs, Patrick & Heybl (57) ABSTRACT

Naturally occurring polarization-induced electric fields in a semiconductor light emitter with crystal layers grown along a polar direction are reduced, canceled or reversed to improve the emitter's operating efficiency and carrier confinement. This is accomplished by reducing differences in the material compositions of adjacent crystal layers, grading one or more layers to generate space charges and quasi-fields that oppose polarization-induced charges, incorporating various impurities into the semiconductor that ionize into a charge state opposite to the polarization induced charges, inverting the sequence of charged atomic layers, inverting the growth sequence of n- and p-type layers in the device, employing a multilayer emission system instead of a uniform active region and/or changing the in-plane lattice constant of the material.

43 Claims, 4 Drawing Sheets

| | |
|---|---|
| p-Type Contact | 115 |
| Cladding 1 | 114 |
| Active Region | 113 |
| Cladding 2 | 112 |
| n-Type Contact | 111 |
| Buffer | 110 |
| Substrate | |

OTHER PUBLICATIONS

Takeuchi et al, Quantum–Confined Stark Effect due to Piezoelectric Fields in GaInN Strained Quantum Wells, *Japanese Journal of Applied Physics*, vol. 36, Part 2, No. 4, 1997, pp. L382–L385.

Bykhovski et al., "Elastic strain relaxation and piezo–effect in GaN–AlN, Gan–AlGaN and GaN–InGaN superlatices", *Journal of Applied Physics*, vol. 81, No. 9, 1997, pp. 6332–6338.

Streetman, *Solid State Electronic Devices*, 4th ed., Prentice–Hall, Inc., 1995, pp. 1–24.

Shuji Nakamura et al., "The Blue Laser Diode, GaN Based Light Emitters and Lasers," Springer, 1997, pp. 21–24.

Herbert Kroemer, "Band Offsets and Chemical Bonding: The Basis for Heterostructure Applications", *The Journal of Physica Scripta*, vol. T68, pp. 10–16, 1996.

Nardelli et al. "Polarization field effects on the electron–hole recombination dynamics in $In_{0.2}$ $Ga_{0.8}$ $N/In_{1-x}Ga_xN$ multiple quantum wells", *Appl. Phys. Lett.* vol. 71 (21),Nov. 24, 1997, pp. 3135–3137.

Zanger et al. "Fiber Optics Communication and other Applications", 1991, Macmillan Publishing Company, pp. 179–182, 250–251.

* cited by examiner

HIGH EFFICIENCY LIGHT EMITTERS WITH REDUCED POLARIZATION-INDUCED CHARGES

RELATED APPLICATION

This application claims the benefit of provisional patent application Ser. No. 60/168,495, filed Dec. 2, 1999.

BACKGROUND OF THE INVENTION

1. Field of the Invention

This invention relates to light emitting compound semiconductor crystals grown on a polar surface and, more particularly, to reduction or cancellation of their naturally occurring polarization-induced charges to improve emission efficiency.

2. Description of the Related Art

Most semiconductor light emitters have a double heterostructure structure that includes an active or light-generating layer grown between two cladding layers. The various layers of the double heterostructure are fabricated from more than one material. One cladding layer is n-type, which means it contains excess free electrons, and one cladding layer is p-type, which means it contains excess holes. In general, the cladding layers have larger bandgaps than the active layer. This causes injected electrons and holes to be confined within the active layer, encouraging efficient recombination of free carriers through spatial localization within the active layer to produce light. In addition, laser diode (LD) emitters also have separate light confining layers, typically comprised of a material with an even wider bandgap, surrounding a double heterostructure. Double heterostructure semiconductor devices are described in numerous publications, including O'Shea et al, *Introduction to Lasers and Their Applications*, Addison-Wesley Publishing Company, December 1978, pages 166–167.

In such structures, polarization-induced charges occur when the material composition varies in a polar direction of its basic crystal structure. A polar direction is defined as any crystal direction not orthogonal to the polarization vector, $\overline{P}$, of the crystal. This is especially true for materials whose crystal bonds are naturally directional and even slightly ionic, such as in III–V or II–VI semiconductors. These charges can be strain-related (piezoelectric) in the case of lattice mismatched materials, composition related (spontaneous) due to differences in the ionic strengths of bonds in different materials, or a combination of the two. The induced charges cause electric fields or potential gradients that have the same effect on free carriers as external fields. The phenomenon is discussed in a number of publications, including Bernardini et al, "Spontaneous polarization and piezoelectric constants of III–V nitrides," *American Physical Society Journal*, Physics Review B, Vol. 56, No. 16, 1997, pages R10 024 to R10 027, and Takeuchi et al, "Quantum-Confined Stark Effect due to Piezoelectric Fields in GaInN Strained Quantum Wells," *Japanese Journal of Applied Physics*, Vol. 36, Part 2, No. 4, 1997, pages L382–L385. The magnitudes of such fields have been estimated to be as high as $2.5 \times 10^6$ V/cm for nitride heterostructures grown on a polar surface of a crystal, Bykhovski et al., "Elastic strain relaxation and piezo-effect in GaN—AlN, Gan—AlGaN and GaN—InGaN superlattices", *Journal of Applied Physics*, Vol. 81, No. 9, 1997, pages 6332–6338.

Polarization-induced charges should be taken into account when considering the electrical characteristics of heterostructures grown on crystal polar surfaces. Crystal layers grown along the 0001 orientation in the case of wurtzite GaN crystal, or along the 111 orientation in the case of zincblende GaAs crystals, are two examples of crystal polar surfaces. The Bravais lattice of the wurtzite structure is hexagonal, with the axis perpendicular to the hexagons usually labeled as the c-axis or the 0001 orientation. Along this axis the structure can be thought of as a sequence of atomic layers of the same element (e.g. all Gallium or all Nitrogen) built up from regular hexagons. Due to this uniformity, each layer (or surface) is polarized and possesses either a positive or a negative charge, generating a dipole across the atomic layers. The charge state of each layer depends upon its constituent atoms. Other examples of crystal planes with various growth directions may be found in Streetman, *Solid State Electronic Devices*, 2nd ed., Prentice-Hall, Inc., 1980, pages 1–24, and Shuji Nakamura et al, "The Blue Laser Diode, GaN Based Light Emitters and Lasers," Springer, 1997, pages 21–24.

Until recently, internal polarization fields associated with the active and cladding regions of a light emitting heterostructure have not posed significant problems. This was because light emitting diodes (LEDs) based on the more established Al—Ga—In—As—P material system have typically been grown on a non-polar crystal surface (in particular the 001 zincblende surface). Recently, however, there has been considerable work in light emitters based on the Al—Ga—In—N ("nitride") materials system, mostly grown along the 0001 orientation of wurtzite crystal, which is a highly polar surface. Nevertheless, nitride double heterostructures have followed conventional non-polar designs.

Figures 1A, 1B, 1C, 3B, 4A:
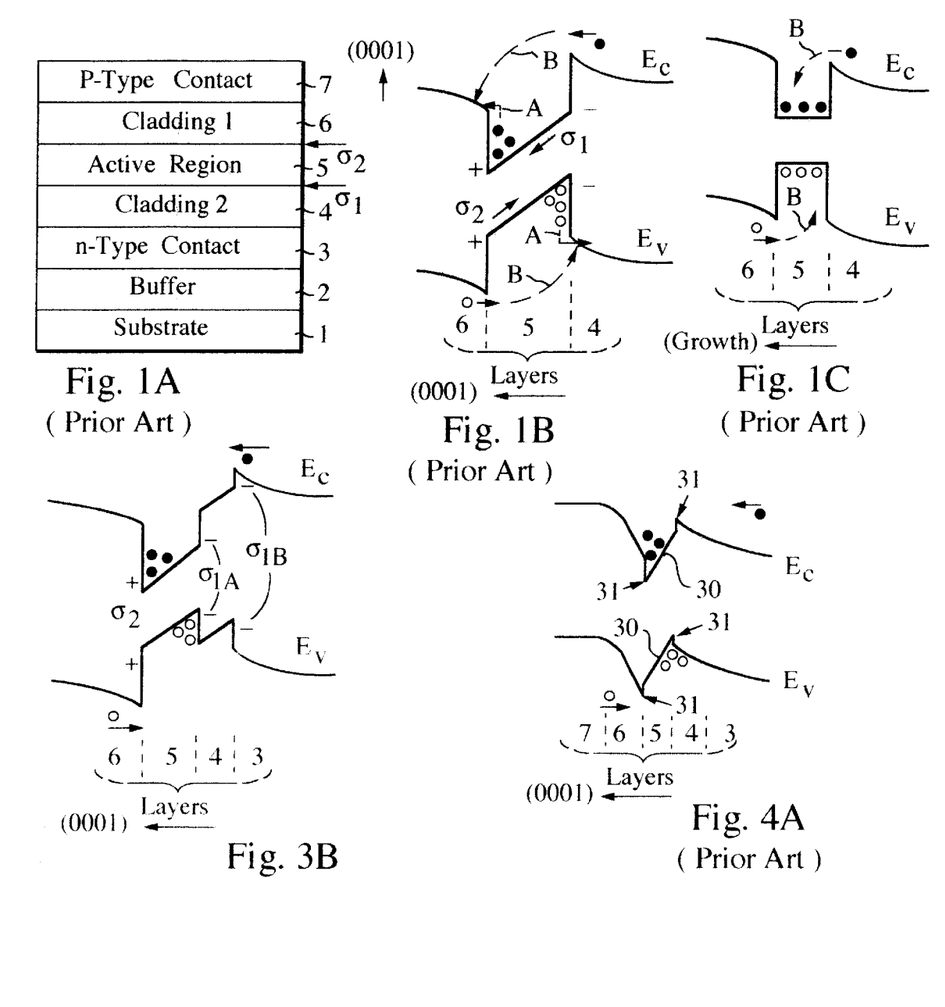
FIG. 1A is an illustrative sectional view of a known structure for a nitride light emitter.
FIG. 1B illustrates the energy bands corresponding to the device of FIG. 1A grown on a polar surface.
FIG. 1C illustrates the energy bands of a known light emitter grown on a non-polar surface.
FIG. 3B illustrates the energy bands corresponding to the device of FIG. 3A.
FIGS. 4A and 4B respectively illustrate the energy bands of a nitride semiconductor with ternary AlGaN and quaternary AlInGaN cladding layers.

FIG. 1A is a sectional view schematically illustrating a typical conventional nitride double heterostructure semiconductor grown in a polar direction. The illustrated substrate layer 1 may be any material suitable for growing nitride semiconductors, including spinel ($MgAl_2O_4$), sapphire ($Al_2O_3$), SiC (including 6H, 4H, and 3C), ZnS, ZnO, GaAs, AlN and GaN. The substrate thickness typically ranges from 100 $\mu$m to 1 mm. A buffer layer 2 on the substrate 1 can be formed of AlN, GaN, AlGaN, InGaN or the like. The buffer layer facilitates possible lattice mismatches between the substrate 1 and an overlying conductive contact layer 3. However, the buffer layer 2 may be omitted if the substrate has a lattice constant approximately equal to that of the nitride semiconductor. The buffer layer 2 may also be omitted with some nitride growth techniques. Depending upon the material composition, the buffer layer energy bandgap may range from 2.1 eV to 6.2 eV, with a thickness of about 0.5 $\mu$m to 10 $\mu$m.

The n-type contact layer 3 is also typically formed from a nitride semiconductor, preferably GaN or InGaN with a thickness ranging from 0.5 $\mu$m to 5.0 $\mu$m, and a bandgap of approximately 3.4 eV for GaN and less for InGaN (depending upon the Indium concentration). A lower n-type or undoped cladding layer 4 on the conductive layer 3 conventionally comprises GaN or AlGaN, with a bandgap of 3.4 eV for GaN and greater for AlGaN (depending upon the Al concentration). Its thickness can range from 1 nm to 100 nm.

Nitride double heterostructures typically employ InGaN as an active region 5 over the lower cladding layer, with a thickness of 1 nm to 100 nm. The bandgap of this layer is typically 2.0 eV, but may vary depending upon the Indium concentration. A top p-type or undoped cladding layer 6 over the active region is generally comprised of AlGaN or GaN, with a thickness and bandgap energy similar to that of the lower n-type cladding layer 4. A p-type GaN conductive contact layer 7 on the cladding layer 6 has an energy bandgap of about 3.4 eV and a thickness of about 10 nm to 500 nm. In general, provided the structure is grown on a polar direction such as the 0001, a polarization-induced sheet charge occurs at the interface between layers due to different constituent materials. Of particular concern for the operation of a light emitter are the polarization-induced charge sheets adjacent to the active region 5.

With the compound semiconductor illustrated in FIG. 1A, a negative polarization-induced charge sheet density $\sigma 1$, with a magnitude such as $10^{13}$ electrons/cm$^2$, is typically formed at the interface between the active region 5 and the lower cladding layer 4. A positive charge sheet density $\sigma 2$ of similar magnitude is formed at the interface between the active region 5 and the upper cladding layer 6. The polarities of these charges depend upon the bonds of the crystal layers, which as mentioned above are directional and slightly ionic. In general, the density of a charge sheet will depend upon both a spontaneous factor arising from compositional differences between the two layers, and a piezoelectric strain arising from the lattice mismatch between the layers. For example, $\sigma 1$ between an $In_{0.2}Ga_{0.8}N$ active region 5 and a GaN cladding layer 4 is about $8.3 \times 10^{12}$ electrons/cm$^2$. This is due to the 20% Indium content in the $In_{0.2}Ga_{0.8}N$ active region (spontaneous polarization), and the strain in that layer arising from the lattice mismatch with the underlying GaN layer (piezoelectric polarization).

Interfacial charge sheets along opposite surfaces of the active region produce a dipole across the region. This dipole corresponds to an electric field whose strength depends on the magnitude of the sheet charges $\sigma 1$ and $\sigma 2$. For the case given above, a sheet charge of $8.3 \times 10^{12}$ cm$^{-2}$ gives an electric field of $1.5 \times 10^6$ V/cm. Based on its origin, we will refer to this electric field as a polarization-induced field. The magnitude of the electrostatic potential drop generated by the dipole depends upon the thickness of the dipole layer. The thickness of the dipole layer refers to its physical dimension in the direction of growth, which is also the distance between $\sigma 1$ and $\sigma 2$. This distance can be used to determine the magnitude of the electrostatic potential drop in a manner similar to the determination of a capacitive potential drop from the distance between two capacitor plates. A distance of 10 nm between charge densities $\sigma 1$ and $\sigma 2$ as given above would result in a polarization-induced potential drop of about 1.5V across the active region 5. The net electric field across the active region also depends on a number of parameters including the doping concentration in the surrounding cladding layers, the built in voltage across the p-n junction and free carrier screening, and is therefore not generally equal to the polarization induced field. However, due to its strength, the polarization-induced field plays a major role in determining the net electric field.

Nitride emitters grown on a 0001 (polar) surface of a crystal have a low emission efficiency of about 1% to 10%. This can be due to the presence of significant polarization fields in or adjacent to their active regions that limit their efficiency. FIG. 1B illustrates the energy bands corresponding to the device structure of FIG. 1A. When the device is operating, the naturally occurring polarization field generated by $\sigma 1$ and $\sigma 2$ reduces the efficiency in a number of ways. First, the dipole leads to a spatial separation (movement in the opposite direction) of electrons and holes within the region. As illustrated, holes in the valence band $E_v$ are attracted to the negative charge sheet $\sigma 1$ at one end of the active region 5, while electrons in the conduction band $E_c$ are attracted to the positive charge sheet $\sigma 2$ at its other end. This spatial separation of free carriers lowers the probability of radiative recombination, reducing emission efficiency.

Second, the energy barriers of the conduction and valence band quantum wells are reduced by quantization effects associated with the electric field. Thus, carriers below $E_v$ and above $E_c$ escape the well through the paths indicated by dashed lines A. Third, the presence of polarization-induced fields also leads to carrier overshoots, illustrated by carrier trajectories B, from the higher $E_c$ level on the $\sigma 1$ side of the active region to the lower $E_c$ level on the $\sigma 2$ side, and from the lower $E_v$ level on the $\sigma 2$ side of the active region to the higher $E_v$ level on the $\sigma 1$ side.

Another issue of concern for applications engineers is the stability of the emission wavelength as the applied bias is increased. If strong polarization-induced fields are present, the emission wavelength will blue-shift as the device bias is increased. As the device bias is increased, mote free carriers accumulate in the conduction and valence band wells. Since the free carriers are spatially separated, they will themselves form a dipole that opposes, or screens, the built-in polarization induced field. As the net electric field is reduced, the quantization states of the quantum wells change, resulting in a blue-shift of the emission wavelength.

FIG. 1C illustrates the energy bands of the active layer 5 and the cladding layers 4 and 6 for a light emitter operating on a non-polar surface with no polarizationinduced charges. All else being equal, its emission efficiency is higher since the three effects discussed above are either absent or greatly reduced.

Several approaches to increase GaN-based LED efficiency have been used. U.S. Pat. Nos. 5,959,307 and 5,578,839, both to Nakamura et al, discuss the addition of Aluminum to the cladding layers to increase the active region barrier heights for a more efficient confinement of free carriers. This addition, however, also changes the material composition of the cladding layers from GaN to AlGaN, which act to increase both spontaneous and piezoelectric polarization fields. The presence of 15% Aluminum in an $Al_{0.15}Ga_{0.85}N$ cladding layer could double the polarization field in the emission layer to about $3 \times 10^6$ V/cm. Such fields may reduce carrier confinement and increase the spatial separation of carriers by changing the energy bands of the light emitter, thereby lowering its radiative efficiency.

SUMMARY OF THE INVENTION

The present invention seeks to improve the operating efficiency of a compound semiconductor LED, with layers grown along a polar direction by: reducing or canceling the effect of the crystal's naturally occurring polarization-induced charges to improve carrier confinement, reducing their spatial separation, and reducing carrier overshoot.

In one embodiment, these charges are lowered by reducing differences in the material compositions of the crystal layers adjacent to the active region. The cladding layers can also be composed of a combination of elements, each of which tend to cancel the polarization effects of the others.

One or more layers in or around the active region can also be graded in composition or doping to generate space charges that oppose the polarization-induced charges, and quasi-fields that oppose polarization-induced fields generated by the polarization-induced charges. The grading may be continuous or discrete.

The compound semiconductor crystal can also have a multilayer emission system consisting of alternating light emitting and non-emitting layers to reduce the average polarization field while improving emission efficiency. The average field in the multilayer emission system as a whole is reduced or canceled compared to a single, uniform active region of comparable thickness.

Various impurities can be incorporated into the crystal that ionize, based upon their energy levels, into a charge state opposite to polarization-induced charges to reduce or cancel their effect. The impurities preferably comprise group II, IV, or VI elements.

The sign of the polarization induced charges can also be inverted to encourage, rather than oppose, the efficient confinement of carriers. These charges are inverted by inverting the atomic layer sequence of the crystal layer. The direction from which the carriers are injected can also be inverted, by inverting the growth order of p and n type layers, to screen polarization induced charges. The lattice constant of the lower buffer layer, contact layer, or cladding layer can also be changed by epitaxial growth techniques to more closely match the lattice constant of the active region. This reduces the strain-induced piezoelectric effect within the active region, reducing the polarization-induced fields for more efficient light emission.

These and other features and advantages of the invention will be apparent to those skilled in the art from the following detailed description, taken together with the accompanying drawings, in which:

DETAILED DESCRIPTION OF THE INVENTION

The following description of various embodiments of the present invention is directed to nitride emitter systems with a double heterostructure construction whose crystal layers are grown normal to the polar direction of the crystal. The nitride emitter is presumed to have the wurtzite crystal structure with layers comprising $Al_xIn_yGa_{1-x-y}N$, where $0 \leq x \leq 1$ and $0 \leq y \leq 1$. Except where noted, the top surface of the crystal is the 0001 orientation with the periodic table group III polarity. The nitride emitter illustrated in FIG. 1A with the corresponding band structures in FIG. 1B will be used as a reference for the various embodiments.

SELECTIVE DOPING

This embodiment reduces or cancels the adverse effects of polarization-induced by incorporating various dopants into the semiconductor. The dopant impurity should be of a type that does not diffuse away from its intended position. The dopants ionize, based upon their energy levels, into either positive or negative charge states, which are opposite to the interfacial polarization-induced charge state, to cancel or reduce its effect. The type of dopant used depends upon the interfacial charge (positive or negative) being targeted. A positive charge would require a dopant that is ionized into a negative charge state, and the opposite for a negative interfacial charge.

Figure 2A:
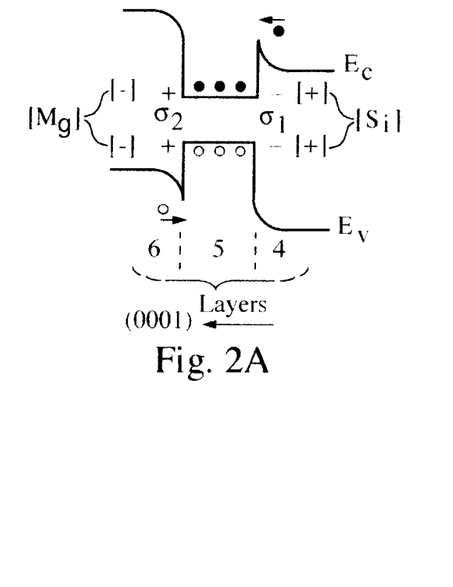
FIG. 2A illustrates the energy bands of the active region and cladding layers with various impurities.

FIG. 2A illustrates the band structure of cladding/active/cladding layers incorporating approximately $10^{13}$ Si atoms/$cm^3$ as a source of positive charge to reduce or cancel the negative interfacial charge density σ1. To reduce or cancel the positive charge density σ2, $10^{13}$ atoms/$cm^3$ of Mg may be used as a source of negative charge. The dopant concentration profile will depend in part upon the dopant ionization energy and donor/acceptor levels. For example, a higher dopant concentration would be required if Zinc (Zn) were used as a source of negative charge dopant to reduce σ2. The impurity profile of the dopant does not have to exactly match/cancel the polarization-induced charges to show a benefit. Other dopant impurities may include group II, IV, or VI elements.

Figure 2B:
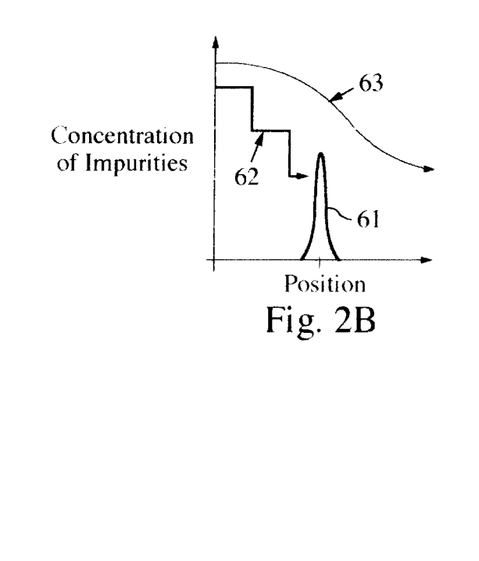
FIG. 2B is a graph illustrating impurity profiles.

There are several methods for distributing (or incorporating) impurities into the semiconductor. For abrupt changes in material composition, in which polarization-induced charges occur in a plane of the interface, the impurity profile is preferably delta-doped at or near the plane. An abrupt change is one in which the change in mole fraction of a given constituent is greater than 1% over a monolayer, i.e. a single crystal layer of atoms. Delta doping attempts to confine the dopants to a single atomic layer, producing a dopant sheet rather than a dopant volume. For graded composition changes, either in discrete steps or continuous, the impurity profile is preferably also graded. FIG. 2B illustrates various types of impurity profiles, including delta 61, graded in discrete steps 62 and continuously graded 63.

INTERMEDIATE COMPOSITION BARRIERS

Figure 3A:
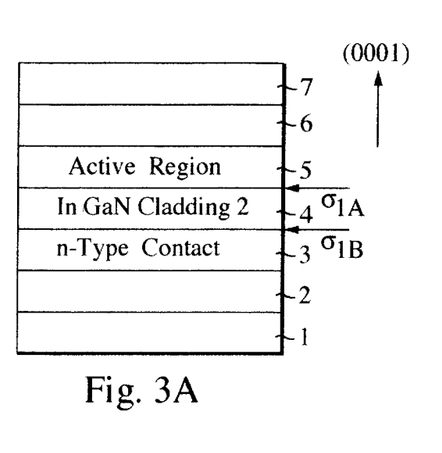
FIG. 3A is an illustrative sectional view of a nitride light emitter having an InGaN cladding layer in accordance with the invention.

This embodiment is directed to improving the emission efficiency of light emitters having GaN cladding layers. The material composition of one or both cladding layers is made intermediate with respect to the material composition of their adjacent layers to reduce or cancel both piezoelectric and spontaneous interfacial polarization-induced charges. Approximately 5% Indium (In) can, for example, be added to the GaN cladding layer 4 of the nitride system of FIG. 1A to change the cladding layer's composition to $In_{0.05}Ga_{0.95}N$. This would make the cladding layer composition intermediate to the $In_{0.20}Ga_{0.80}N$ active region 5, with 20% Indium, and GaN conductive layer 3 with 0% Indium. As illustrated in FIG. 3A, the Indium reduces differences in the material compositions of the two adjacent layers, resulting in a 25% lower interfacial polarization-induced charge sheet density $\sigma1A$ of approximately $0.75\times10^{13}$ electrons/cm$^2$ between the active and cladding layers. $\sigma1B$ is about $0.25\times10^{13}$ electrons/cm$^2$. If donor-type doping is present near one or both of the interfaces that contain $\sigma1A$ or $\sigma1B$, some of the piezo-induced charge will be screened out, as discussed in the selective doping embodiments above. Since $\sigma1A$ and $\sigma1B$ are both smaller than the combination $\sigma1A+\sigma1B$, this device structure eases the ability to selectively screen out some of the polarization-induced charges, compared with the conventional structure, while keeping dopants away from the active region. This is done by heavily n-type doping the interface with $\sigma1B$ so that all of this charge is effectively screened. In this way, the electric field in the active region is reduced by as much as 25% over the conventional structure, increasing emission efficiency. FIG. 3B illustrates the band diagram for this case. Further reduction is obtained if n-type doping extends towards interface containing $\sigma1A$. The more Indium used in the cladding layer, the lower the field in the active region. However, if too much Indium is used, the carrier confinement may be compromised. The same technique can be applied to the upper cladding layer, except that p-type doping should be used for the charge screening.

By adding Indium to one or both of the cladding layers, the polarization-induced electric field in the active region under device operation goes down, leading to an increase in the emission efficiency despite lower energy barriers. Improved LED efficiency in the 450 nm to 470 nm range was demonstrated using a low Indium content of about 5% in the lower cladding layer 4, compared to a cladding layer with no Indium.

QUARTERNARY BARRIERS

This embodiment is directed to improving the emission efficiency of light emitters having ternary AlGaN cladding layers. The addition of Aluminum Nitride (AlN) to the original GaN cladding layers to produce ternary AlGaN layers is known. This addition generates cladding layer bandgaps that are larger than the bandgaps of their adjacent contact and active layers to produce higher energy barriers on the opposite sides of the active region, thereby improving carrier confinement. However, the added Aluminum also increases variations in material composition that produce interfacial polarization-induced charges. In fact, both spontaneous and piezoelectric polarization-induced charges, which are determined by the change in the polarity of Ga to N bonds from one layer to the next, are actually increased at the active region/cladding layer interfaces. The increase in charges is due to both the piezoelectric strain and spontaneous polarization differences in the two materials. As a result high electric fields exist in the active region of the device.

One aspect of the invention reduces the strain and polarization differences by making their material compositions more similar. Indium Nitride (InN) is added to one or both of the ternary AlGaN cladding layers to produce a quarternary AlInGaN layer, which makes the average polarity of the bonds in both the cladding and the active layers similar. The presence of Indium in their layers counteracts the effect of Aluminum in generating interfacial piezoelectric polarization-induced charges at the active layer/cladding layer interfaces. That is, there is a smaller charge sheet between a quarternary AlInGaN cladding layer and an InGaN active region, than there is between a ternary AlGaN cladding layers and an InGaN active region. Most of the polarization-induced charge in the structure is confined to heavily doped regions within the cladding or contact layers that are removed from the active region and can be effectively screened. The amount of Indium added to these layers will generally depend upon the layer thickness, material composition, and growth limitations. For example, an $Al_{0.12}In_{0.03}Ga_{0.85}N$ cladding layer next to an $In_{0.05}Ga_{0.95}N$ active layer reduces the interfacial piezoelectric charge density by approximately 30%, to $0.7\times10^{13}$ electrons/cm$^2$, compared to an $Al_{0.15}Ga_{0.85}N$ layer next is the same active layer, reducing the electric field in the active region by approximately 30%.

The Indium and Aluminum components of the quaternary cladding layers tend to cancel each other's effect on the energy barriers associated with the active region. Although the addition of Indium to the AlGaN cladding layer lowers the active region's energy barriers, the confinement efficiency actually increases due to reductions in polarization-induced charges.

The cladding layers need not have identical compositions to improve the emitter efficiency. For example, improved LED efficiency of about 25% at an emission wavelength of 380 nm was demonstrated using only an upper quaternary $Al_{0.15}In_{0.03}Ga_{0.82}N$ cladding with energy barriers of 0.26 eV $E_c$ and 0.08 eV $E_v$. The composition of the lower cladding layer was maintained as $Al_{0.15}Ga_{0.85}N$.

Figure 4B:
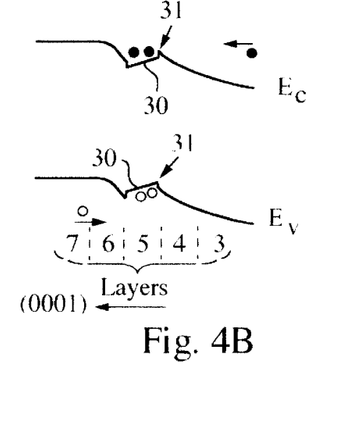

Schematic diagrams under forward bias conditions close to turn-on of an LED (i.e. close to the threshold for light emission), for cladding layers with ternary AlGaN and quarternary AlInGaN compositions, are illustrated in FIGS. 4A and 4B, respectively. In both structures the cladding layers 4 and 6 contain the same concentration of Aluminum, but with no Indium in the ternary structure. In both figures, the slope of the line 30 in the active region 5 represents the polarization-induced field. Its strength depends upon the biasing between the contacts 3 and 7, doping in the cladding layers 4 and 6, and the magnitude of the interfacial polarization charge sheet densities. The biasing used for both structures is about 2.6V, with an n-type (Si) dopant concentration of approximately $1\times10^8$/cm$^3$ in the cladding layer 4, and a p-type (Mg) dopant concentration of approximately $1\times10^9$/cm$^3$ in the cladding layer 6. The magnitude of the polarization induced electric field generated across the active region 5 with the ternary AlGaN cladding layers is approximately $8.8\times10^5$ V/cm.

As illustrated in FIG. 4A, this field tends to spatially separate the electrons and the holes injected from GaN contact layers 3 and 7 by confining the carriers near interfaces 31 that are furthest away from their respective injecting contacts. This phenomenon reduces the radiative recombination probability of the carriers. The quarternary AlInGaN cladding layers 4 and 6 illustrated in FIG. 4B exhibit a much lower polarization induced field in the active region 5. For an $Al_{0.05}In_{0.025}Ga_{0.925}N$ lower cladding layer 4 and an $Al_{0.20}In_{0.10}Ga_{0.70}N$ upper cladding layer 6, the field is approximately $4.6\times10^5$ V/cm. These layers also exhibit lower quantization energies 31, reducing the spatial separation of free carriers to improve radiative recombination. There is a trade-off between the reduction of polarization-induced charges and the maintenance of high energy barriers for maximum carrier confinement, which can be determined empirically.

CLADDING LAYERS WITH GRADED COMPOSITION

In this embodiment, the composition of one or both of the cladding layers is graded to generate a space charge that opposes interfacial polarization effects at the interfaces between the cladding layers and the active region. The grading varies the layer composition in the polar direction to generate piezoelectric charges. The grading may be either continuous or discrete. The distributed charge polarity should be opposite to that of the targeted interfacial polarization charges. The polarity is determined by the composition of the graded layer and its two adjacent layers. For example, the lower GaN contact layer 3 and the lower AlGaN cladding layer 4 of FIG. 1A generate a positive interfacial charge sheet density. This charge may be distributed over the volume of the cladding layer 4 by gradually varying the Aluminum content of this layer. In particular, the lower cladding layer 4 may be graded from a GaN composition with 0% Aluminum near the GaN conductive layer 3, to $Al_{0.10}Ga_{0.090}N$ with 10% Aluminum near the InGaN active region 5. The positive space charge generated would partially counter the $0.75 \times 10^{13}$ electrons/cm$^2$ negative charge sheet density σ1 at the $Al_{0.10}Ga_{0.90}N/In_{0.05}Ga_{0.95}N$ interface.

Figure 5:
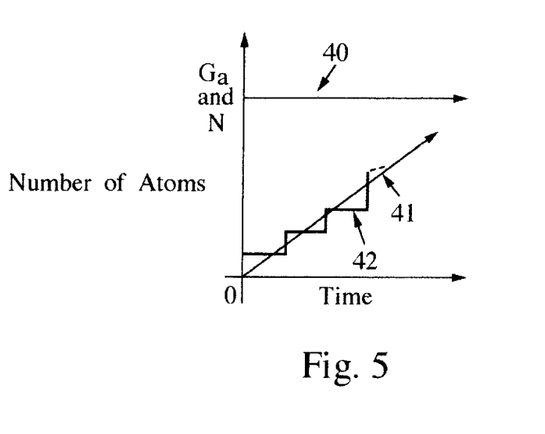
FIG. 5 is a graph illustrating the relationship between the concentration of atoms as a function of time during cladding growth.

The negative interfacial charge density that exists between the upper GaN contact layer 7 and the upper AlGaN cladding layer 6 may be distributed over the volume of layer 6 by grading its Aluminum content. The negative space charge generated would counter the positive charge density σ2 to reduce or cancel its effects upon the active region. The magnitude of the space charge depends upon the distance over which the grade occurs. FIG. 5 graphically illustrates the grading of the AlGaN cladding layer by the addition of Aluminum atoms (continuously 41 or discrete steps 42) to the crystal surface per unit of time, starting with 0% Aluminum. The added concentration of Gallium and Nitrogen atoms 40 is kept uniform throughout the growth period. The process is stopped when an appropriate cladding layer thickness and grading is achieved. A varying period superlattice of two materials can also be used to make a compositional grade.

There is a trade-off between the optimal device performance due to availability of free carriers near the active region, and the adverse effects of dopant diffusion into it. The space charge which is generated by grading the cladding layer allows the dopant impurities to be placed outside the graded layer (e.g. in the conductive layer only), while attracting their free carriers. The space charge associated with the graded composition naturally attracts the free dopant carriers into the cladding layer from the adjacent conductive layer. Therefore, doping impurities need not be near the active region to provide free carriers to this region, and may be eliminated or reduced in the adjacent cladding layers.

ACTIVE REGION WITH GRADED OR MIXED COMPOSITION

Figure 6A:
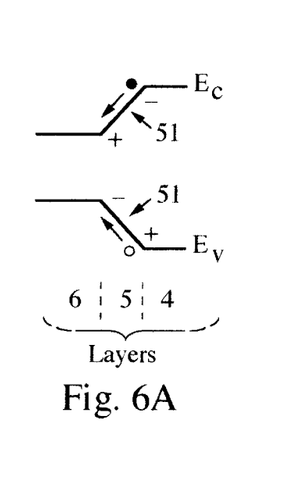
FIG. 6A illustrates the energy bands of an active region in a quasi-field.

The effect of compositional changes in a semiconductor device on free carriers can be similar to that of an electric field, and are referred to as quasi-fields. See Herbert Kroemer, "Band Offsets and Chemical Bonding: The Basis for Heterostructure Applications", *The Journal of Physica Scripta*, Vol. T68, pages 10–16, 1996. This embodiment of the invention uses a quasi-field to counter the effects of polarization-induced electric fields on free carriers. The establishment of a quasi-field in the active region is possible without the presence of any charges within the system. FIG. 6A illustrates quasi-fields that are generated by gradients 51 in the energy bands, rather than from true electric charges. These gradients can be produced by grading the composition of the active region 5. In a quasifield, electrons in the conduction band move to a lower energy level towards the positive charge, and the holes in the valence band move to a higher energy towards the negative charge. Note that the active region band structures in this field are not parallel. By contrast, the energy bands within an electric field exhibit a parallel relationship, as illustrated in FIG. 1B. The active region can be compositionally graded to generate a desired gradient in band structure, and thereby a desired quasi-field effect. The resulting quasi-field, however, should oppose the true electric field's effect on at least one carrier type. The active region material composition may be graded (continuously or discretely) by varying its Indium content. Depending upon the region's width and the desired emitter properties, it may incorporate a graded composition from a low to a high Indium content or vice versa. Properties of concern typically include the emission wavelength and the operating current.

Figure 6B:
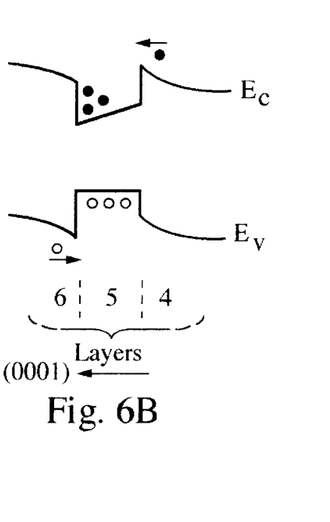
FIGS. 6B and 6C respectively illustrate the energy bands of continuously graded active regions.
Figure 6C:
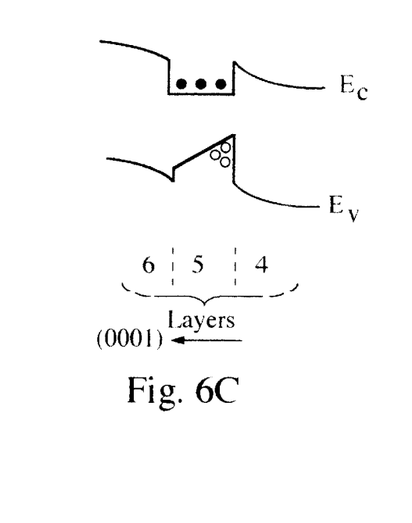

FIGS. 6B and 6C illustrate the net effect of quasi-fields on the energy bands of the active region 5. In FIG. 6B the active region has a continuously graded Indium concentration from a low of 5% to a high of 10%, with a gradient of approximately 1%/nm. The Indium concentration is lowest at the interface between the cladding layer 4 and the active region 5, and increases to the highest concentration on the opposite side of the active region. In this case the quasi-field reduces the polarization-induced electric field in the valence band. A grading in the opposite direction will offset the electric field in the conduction band. In FIG. 6C, the active region has an Indium gradient and concentrations again from 5% to 10% and an average gradient of 1%/nm, but in the opposite direction. Since one of the carrier types, elections or holes is now spread out, there is better spatial overlap of the carriers, increasing emission efficiency.

MULTILAYER EMISSION WITH FIELD-COMPENSATION BARRIERS

Figure 7A:
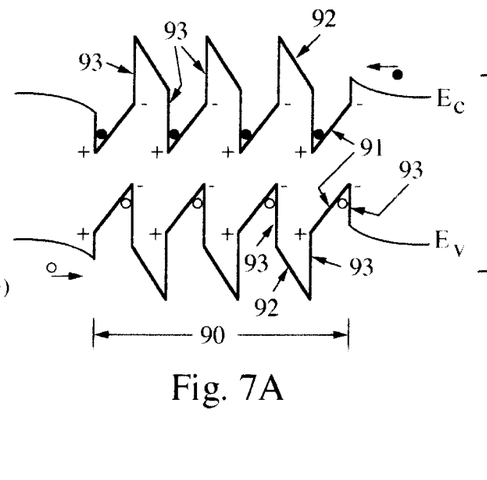
FIG. 7A illustrates the energy bands of a multilayer light emission system.
Figure 7B:
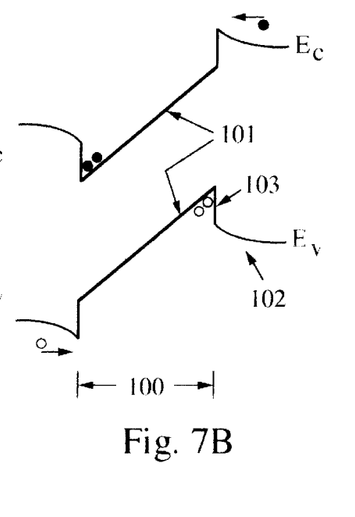
FIG. 7B illustrates the energy bands of a single active region with a width equivalent to the multilayer emission system of FIG. 7A.

FIG. 7A illustrates the energy bands for a multilayer emission system 90 with field-compensation energy barriers 93. In this embodiment, the emissions system 90 consists of multiple layers with alternating active regions 91 (i.e. light emitting) and cladding layers 92 (non-emitting) The energy barriers 93 of the claddings 92 have the dual function of confining injected carriers in the active region 91, and opposing its polarization-induced fields. The generated field and total thickness of the multilayer emission system 90 will in general depend upon the number, thickness, and composition of the individual active regions 91 and the cladding layers 92. The multilayer system 90, with four $In_{0.1}Ga_{0.9}N$ active regions 91 each 2 nm thick and three $Al_{0.05}Ga_{0.95}N$ cladding layers 92 each 5 nm thick, would have a total thickness of 23 nm with an approximate average polarization-induced field strength of $4.5 \times 10^5$ V/cm. The band structure of a single active region 100 with comparable volume, illustrated in FIG. 7B, could exhibit a polarization field strength of $9 \times 10^5$ V/cm. The use of a multilayer emission system increases the total volume of the active material while ensuring that the average field due to the polarization-induced charges in the active region as a whole is reduced compared to a structure with a single active region of comparable volume.

INVERTED POLARIZATION

Figure 8A:
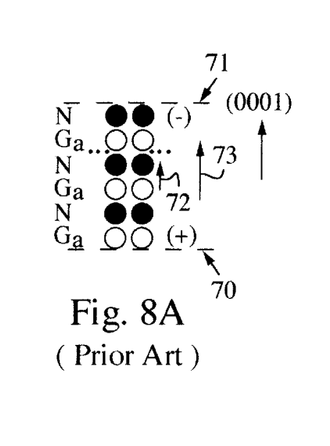
FIG. 8A is a sectional view illustrating the atomic layer structure corresponding to a single layer of the structure shown in FIG. 1A.

In this embodiment, the naturally occurring polarization-induced charges of a compound semiconductor are inverted to improve carrier confinement. The interatomic bonds in GaN are naturally ionic because the Gallium atom is slightly positive and the Nitrogen atom negative, generating a dipole across the bond. FIG. 8A illustrates individual Gallium and Nitrogen atomic layers grown along the polar direction of the crystal surface. With the order illustrated, successive atomic layers alternate between Ga and N, with the bottom surface 70 of each layer a single atomic layer of Gallium atoms and the top surface 71 Nitrogen. The individual dipoles 72 across each GaN atomic pair add up to generate an average polarization-induced field 73 across the layer in the direction indicated. Its effect on the energy bands of the active region was described above in connection with FIG. 1B.

Figures 8B, 8C:
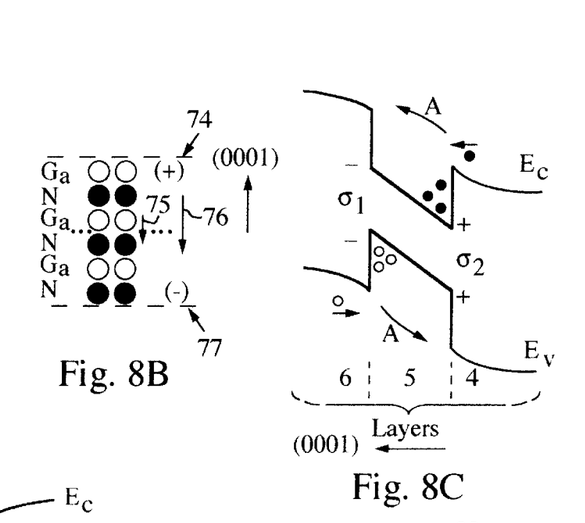
FIG. 8B is a sectional view illustrating an inverted atomic layer structure of a single semiconductor layer.
FIG. 8C illustrates the energy bands of cladding and emission layers corresponding to the device structure of FIG. 8B.

The direction of this naturally occurring polarization-induced field 73 can be inverted by inverting the direction of the individual atomic dipoles 72. This is accomplished by reversing the growth order of the Gallium and Nitrogen atomic layers. In FIG. 8B, the inverted growth order of atomic layers starts with Nitrogen, and than alternates between Gallium and Nitrogen atomic layers until the top surface Ga layer 74 is reached. The growth order of atomic layers can be changed in several ways. First, if one starts with a N-terminated GaN or AlGaN substrate, one can grow the N-faced polarity without difficulty. However, most growth is done on sapphire or SiC and the growth naturally desires to be of the Ga-polarity. There are techniques to change the polarity. One technique involves using MBE growth under N-rich conditions to change the polarity. A second technique uses deposition of about 1 monolayer of Magnesium on the surface, which results in N-polarity growth for subsequent layers. A third way is to use atomic layer epitaxy by MOCVD or MBE to try to force the nucleation to be in the correct polarity.

The individual dipoles 75 generate a polarization-induced field 76 in a reverse direction to field 73 of FIG. 8A. Its effect on the energy bands of the active region is illustrated in FIG. 8C. Although this growth order continues to generate a polarization-induced electrical field in the active region, the field's dipole is reversed. This enables the injected carriers to screen (neutralize) the polarization-induced charge densities σ1 and σ2 before the device turn-on, i.e. before free carriers start to recombine. The electrons injected towards the active region from the cladding layer 4 above $E_c$ build up near σ2 at the cladding/active region interface. The accumulated charges of these free carriers neutralize σ2. Similarly, the holes injected from the cladding layer 6 below $E_v$ neutralize σ1 near the active region/cladding interface. Before device turn-on, this process "flattens" the active region energy bands, similar to those illustrated in FIG. 1C. Consequently, the efficiency of the device is not reduced by the polarization-induced charges. A further benefit of this device structure is that the carrier overshoots denoted as paths A are dramatically reduced compared to the conventional structure. Also, the carrier confinement of both electrons and holes is increased.

INVERTED STRUCTURE

Figure 9A:
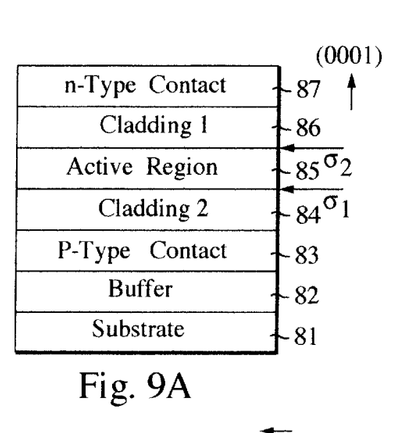
FIG. 9A is a sectional view illustrating an inverted nitride light emitter with p-type layers grown before n-type.
Figure 9B:
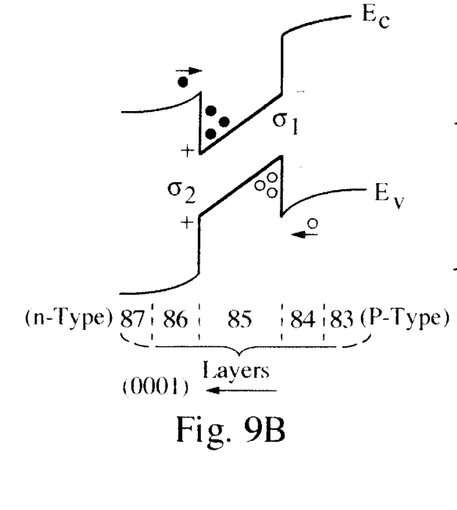
FIG. 9B illustrates the energy bands corresponding to the device of FIG. 9A.

In a conventional LED, the n-type layers are grown before the p-type. This embodiment inverts this growth sequence. FIG. 9A is a sectional view schematically illustrating an LED formed with the new growth sequence, with the p-type contact and cladding layers 83, 84 grown before the n-type cladding and contact layers 86 and 87. The thickness and material compositions of all the layers in this embodiment are similar to those for the nitride emitter described in connection with FIG. 1A. Despite an inverted layer structure, interfacial polarization induced charge sheet densities σ1 and σ2 are still forward due to variations in material composition between layers. Their effect on the energy bands of the active region is illustrated in FIG. 9B, which is essentially similar to FIG. 1B. However, inverting the growth order of the p- and n-type layers has also changed the direction from which electrons and holes are injected into the active region. In this way the electrons, which are always injected from the n-type contact layer, are injected into the active region 85 from the contact layer 87 above $E_c$, shown to the left of the active region 85. The holes are injected from the p-type contact layer 83 below $E_v$ from the right. This inverted layer sequence enables the carriers to screen the charge densities before the device turn-on in a manner similar to the previous embodiment, in which the field direction was inverted instead of the layer structure. This structure also reduces carrier overshoot and increases carrier confinement in a manner similar to the previous embodiment.

CHANGING THE LATTICE CONSTANT

Figure 10A:
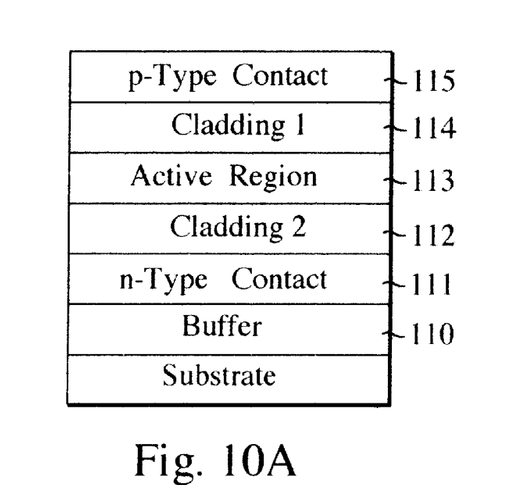
FIG. 10A is a sectional view illustrating a nitride light emitter with a new buffer that has a lattice constant more closely matched with the active region.
Figure 10B:
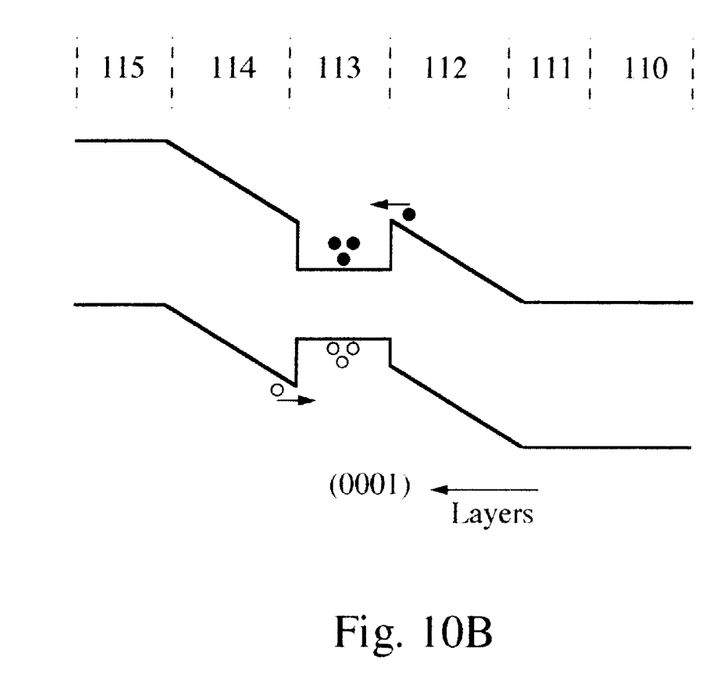
FIG. 10B illustrates the energy bands corresponding to the device of FIG. 10A.

FIGS. 10A and 10B illustrate another method of engineering the polarization fields in the structure. By changing the in-plane lattice constant of the structure beneath the active region 113 so that the active layer is under less strain, or the strain direction is reversed, the piezoelectric polarization-induced fields can be reduced, eliminated, or reversed in the active region as shown in the band diagram of FIG. 10B. The underlying lattice constant can be changed in several ways. First, the buffer layer 110 can be grown with a different material composition, such as InAlGaN, so that the in-plane lattice constant of the buffer layer is close to the in-plane lattice constant of the InGaN active layer. The bandgap of the InAlGaN buffer layer will also be larger than that of the InGaN active layer so that there will be no light absorption. A second method for changing the in-plane lattice constant is to use the conventional buffer layer, but grow at least part of the n-contact layer 111 with a different material composition, such as AlInGaN, than the buffer layer so that the in-plane lattice constant is changed from that of the buffer layer to a value closer to that of the active region. Thus, the same benefits as described above are realized. A third method changes the lattice constant within the lower cladding layer 112 in the same way as described for the n-contact layer. In a fourth method, the active region is grown thick enough to cause strain-relaxation, thus eliminating the piezoelectric-induced electric field in the active layer. The method chosen will generally be the one providing the least amount of material dislocations, preserving the materials quality while providing the device structure advantages described above.

There are a number of ways to further reduce or cancel most of the residual polarization-induced charges. The various embodiments discussed above could be mixed-and-matched and applied to any one or all appropriate layers, emitting or non-emitting. For any given application, the particular embodiment or combination of embodiments would depend upon the nature of the application, and can be determined empirically. For example, one possibility would be to combine AlGaN cladding layers 92 and InGaN active regions 91 with the counteracting effects of Aluminum and Indium mentioned in connection with quarternary barriers. Another would be to grade the Aluminum content of at least one cladding layer 92 and/or to add impurities that ionize into a charged state opposing the interfacial polarization-induced charges.

While several illustrative embodiments of the invention have been shown and described, numerous variations and alternate embodiments will occur to those skilled in the art. For example, although the description was directed to nitride emitters, any or all of the embodiments may be used to address the problems of polarization-induced charges in light emitters comprised of other materials. Such variations and alternate embodiments are contemplated, and can be made without departing from the spirit and scope of the invention as defined in the appended claims.

We claim:

1. An optical emitter, comprising:
    an n-type contact layer;
    a p-type contact layer;
    an active light emitting region sandwiched between cladding layers, said active region and cladding layers between said n-type and p-type contact layers;
    dipoles across said active region, said dipoles formed from interfacial charge sheets along the interfaces between said active region and said cladding layers, said dipoles generating a polarization induced field across said active region that reduces the light emitting efficiency of said optical emitter; and
    a means for at least decreasing some of the efficiency reducing effect of said polarization-induced field across said active region.

2. The optical emitter of claim 1, wherein said means for decreasing the efficiency reducing effect comprises the addition of dopant impurities in at least one of said cladding layers to reduce said polarization induced field by canceling at least some of the charge at said interfacial charge sheet adjacent to said doped cladding layer.

3. The optical emitter of claim 2, wherein said interfacial charge sheets comprise a positive and negative interfacial charge sheet, wherein a negative dopant impurity is added to said cladding layer adjacent to said positive interfacial charge sheet.

4. The optical emitter of claim 2, wherein said interfacial charge sheets comprise a positive and negative interfacial charge sheet, wherein a positive dopant is added to said cladding layer adjacent to said negative interfacial charge sheet.

5. The optical emitter of claim 3, wherein said negative dopant is Mg.

6. The optical emitter of claim 4, wherein said positive dopant is Si.

7. The optical emitter of claim 1, wherein said means for decreasing the efficiency reducing effect comprises an intermediate composition in at least one of said cladding layers with respect to said active region and said contact layer adjacent to said intermediate composition cladding layer, said intermediate composition cladding layer reducing its adjacent said interfacial charge sheet.

8. The optical emitter of claim 7, wherein said active region is $In_{0.20}Ga_{0.80}N$, said intermediate composition cladding layer is $In_{0.05}Ga_{0.95}N$, and said adjacent contact layer is GaN.

9. The optical emitter of claim 1, wherein said means for decreasing the efficiency reducing effect comprises said active region being InGaN and the addition of In to at least one of said cladding layers such that at least one cladding layer comprises $Al_xIn_yGa_{1-x-y}N$ where $0 \leq x \leq 1$ and $0 \leq y \leq 1$, the presence of In in said cladding layer counteracting the effect of Al in generating an interfacial charge sheet adjacent to said cladding layer.

10. The optical emitter of claim 1, wherein said means for decreasing the efficiency reducing effect comprises a gradient in the composition in at least one of said cladding layers, said gradient generating a space charge to oppose the interfacial charge sheet at the interface between said graded composition cladding layer and said active region.

11. The optical emitter of claim 1, wherein said means for decreasing the efficiency reducing effect comprises a gradient in the composition of said active region, said gradient producing a quasi-field to counter the impact of said interfacial charge sheets and polarization induced electric field.

12. The optical emitter of claim 11, wherein said gradient is continuous or discrete.

13. The optical emitter of claim 11, wherein said active region is graded with Indium from 5 to 10% with an average gradient rate of 1%/nm.

14. The optical emitter of claim 1, wherein said means for decreasing the efficiency reducing effect comprises said active layer having multiple active regions alternating with cladding layers, said cladding layers confining injection in said multiple active regions and opposing the polarization induced fields of said active regions.

15. The optical emitter of claim 1, wherein said means for decreasing the efficiency reducing effect comprises inverting said active region atomic dipoles by reversing the growth order of the atomic layers that make up the compounds in said active region, resulting in screening of said interfacial charge sheets prior to turn on of said optical emitter.

16. The optical emitter of claim 1, wherein said means for decreasing the efficiency reducing effect comprises said p-type contact layer preceding said n-type contact layer in growth order, resulting in screening of said interfacial charge sheets at turn on of said optical emitter.

17. The optical emitter of claim 1, wherein said means for decreasing the efficiency reducing effect includes one of said layers beneath said active region having an in-plane lattice constant that reduces or reverses the strain experienced by said active region.

18. The optical emitter of claim 17, grown on a buffer, wherein said buffer has an in-plane lattice constant close in value to the in-plane constant of said active region.

19. The optical emitter of claim 17, wherein said n-type contact layer is below said active region, said n-type contact layer having an in-plane lattice constant close in value to the in-plane lattice constant of said active region.

20. The optical emitter of claim 17, wherein one of said cladding layers is below said active region, said lower cladding layer having an in-plane lattice constant close in value to the in-plane lattice constant of said active region.

21. An optical emitter grown along a crystal polar direction, comprising:
    a plurality of crystal layers whose material compositions vary in said polar direction, said plurality of layers comprising at least an active region sandwiched between two cladding layers, said varied composition generating oppositely charged interfacial charge sheets at the interfaces between said active region and cladding layer;
    at least one of said cladding layers incorporating dopant impurities that ionize into a charged state opposite to the sheet charge at the interface between said doped cladding layer and said active region to cancel at least some of said sheet charge.

22. The optical emitter of claim 21, wherein said doped cladding layer is adjacent to the positively charged of said oppositely charged interfacial charge sheets, said dopant impurity being negatively charged.

23. The optical emitter of claim 22, wherein said doped cladding layer is adjacent to the negatively charged of said oppositely charged interfacial charge sheets, said dopant impurity being positively charged.

24. An optical emitter grown normal to a crystal polar direction, comprising:
   n- and p-type contact layers;
   an active region sandwiched between two cladding layers, said active region and cladding layers between said n- and p-type contact layers;
   interfacial sheet charges at the interfaces between said active region and cladding layers;
   at least one of said cladding layers having an intermediate material composition relative to said active region and adjacent n- or p-type layer, said intermediate composition reducing the charge of the sheet charge adjacent to said doped cladding layer.

25. The optical emitter of claim 24, wherein said at least one layer is an $Al_xIn_yGa_{1-x-y}N$ cladding layer, where $0 \leq x \leq 1$ and $0 \leq y \leq 1$.

26. The optical emitter of claim 24, wherein said active region is $In_{0.20}Ga_{0.80}N$, said cladding layer is $In_{0.05}Ga_{0.95}N$, and said adjacent contact layer is GaN.

27. An optical emitter grown normal to a crystal polar direction, comprising:
   a plurality of crystal layers comprising at least an active region sandwiched between two cladding layers, said layers having material compositions that vary in said polar direction to generate a polarization-induced charge concentration in said active region;
   said active layer comprised of a ternary compound material and at least one of said cladding layer comprised of a quaternary material that results in a reduced polarization induces charge concentration at the interface between said active region and said quaternary cladding layer.

28. The optical emitter of claim 27, wherein said active layer comprises InGaN and at least one of said cladding layers comprises AlInGaN.

29. An optical emitter grown normal to a crystal polar direction, comprising:
   a plurality of crystal layers comprising at least an active region sandwiched between two cladding layers, said layers having material compositions that vary in said polar direction to generate a polarization-induced charge concentration in said active region;
   at least one of said cladding layers having a composition that is graded to generate a space charge over a volume of said grade that opposes said charge concentration.

30. The optical emitter of claim 29 wherein said graded cladding layer comprises $Al_xIn_yGa_{1-x-y}N$, where $0 \leq x \leq 1$ and $0 \leq y \leq 1$.

31. An optical emitter grown along a crystal polar direction, comprising:
   a plurality of crystal layers, comprising at least an active region sandwiched between two cladding layers, said layers having material compositions that vary in said polar direction;
   at least one of said layers having its composition graded to generate a space charge over a volume of said grade that allows dopant impurities to be set back from an adjacent layer.

32. The optical emitter of claim 31, wherein said graded layer comprises $Al_xIn_yGa_{1-x-y}N$, where $0 \leq x \leq 1$ and $0 \leq y \leq 1$.

33. An optical emitter grown along a crystal polar direction, comprising:
   a plurality of crystal layers comprising at least an active region sandwiched between two cladding layer, said layers having material compositions that vary in said polar direction to generate a polarization-induced electric field in said active region;
   said active region having a composition that is graded to generate a quasi-field that opposes said polarization-induced electric field.

34. The optical emitter of claim 33, wherein said grading generates gradients in the energy bands of said active region to produce said quasi-field.

35. The optical emitter of claim 33, wherein said active region is comprised of $In_yAl_xGa_{1-x-y}N$, where $0 \leq y \leq 1$ and $0 \leq x \leq 1$.

36. An optical emitter grown along a crystal polar direction, comprising:
   at least one each of p-type and n-type crystal layers whose material compositions vary in said polar direction to generate a polarization-induced charge concentration in at least one of said layers the adversely effects the performance of said emitter;
   a plurality of crystal layers between said p-type and n-type crystal layers, said plurality of layers including at least an active region sandwiched between two cladding layers;
   said p-type layer preceding said n-type layer in growth sequence to reverse the effect of said charge concentration on said optical emitters performance.

37. An optical emitter grown normal to a crystal polar direction, comprising:
   a plurality of crystal layers including at least an active region sandwiched between two cladding layers, said layers having compositions that vary in said polar direction to generate a polarization-induced electric fields in at least one of said layers;
   one of said layers comprising a multilayer active region that comprises alternating optical emitting and non-emitting layers, with said non-emitting layers confining injected carriers in said emitting layers and opposing said electric fields.

38. The optical emitter of claim 37, wherein the material composition of at least one of said non-emitting layers is graded to create a quasi-field opposing said electric fields.

39. The optical emitter of claim 37, wherein the material composition of at least one of said emitting layers is graded to create a quasi-field opposing said electric fields.

40. The optical emitter of claim 38, wherein the material composition of at least one of said non-emitting layers is graded to create a quasi-field opposing said electric fields.

41. The optical emitter of claim 37, wherein at least one of said non-emitting layers includes dopant impurities to provide space charge that will oppose said electric fields.

42. An optical emitter grown normal to a crystal polar direction, comprising:
   a plurality of crystal layers whose material compositions vary in said polar direction to generate polarization-induced electric fields in at least one of said layers;

at least one of said layers being an active region;

at least a second one of said being below said active region and being at least partially strain-relaxed such that the in-plane lattice constant of said layer below said active region is close to the unstrained in-plane lattice constant of said active region, thus reducing, eliminating, or reversing said electric field in said active region.

43. An optical emitter grown normal to a crystal polar direction, comprising:

a plurality of crystal layers whose material compositions vary in said polar direction to generate polarization-induced electric fields in at least one of said layers;

at least one of said layers being an active region;

said active region grown thick enough so that the material in the active region is at least partially strain-relaxed, thereby reducing said electric field in at least said active region.

* * * * *